(12) United States Patent
Kobayashi

(10) Patent No.: US 9,153,505 B2
(45) Date of Patent: Oct. 6, 2015

(54) METHOD FOR MANUFACTURING SIC SEMICONDUCTOR DEVICE

(71) Applicant: Mitsubishi Electric Corporation, Tokyo (JP)

(72) Inventor: Kazuo Kobayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/261,835

(22) Filed: Apr. 25, 2014

(65) Prior Publication Data

US 2015/0072448 A1    Mar. 12, 2015

(30) Foreign Application Priority Data

Sep. 10, 2013   (JP) .................. 2013-186847

(51) Int. Cl.
*H01L 21/66* (2006.01)
*H01L 21/265* (2006.01)

(52) U.S. Cl.
CPC .......... *H01L 22/14* (2013.01); *H01L 21/26513* (2013.01)

(58) Field of Classification Search
CPC .............. H01L 21/02378; H01L 21/02447; H01L 21/02529; H01L 21/02614; H01L 21/0445; H01L 21/046; H01L 21/265; H01L 21/324; H01L 21/31051; H01L 21/67248; H01L 21/8213; H01L 22/10; H01L 22/14; H01L 22/34; H01L 29/1608
USPC ........... 438/14, 369, 370, 514, 522, 526, 530
See application file for complete search history.

(56) References Cited

U.S. PATENT DOCUMENTS

| | | | |
|---|---|---|---|
| 2009/0081858 A1* | 3/2009 | Qin et al. | ...... 438/527 |
| 2011/0215338 A1* | 9/2011 | Zhang | ............... 257/73 |
| 2012/0302051 A1 | 11/2012 | Matsuno et al. | |
| 2014/0038397 A1 | 2/2014 | Matsuno et al. | |

FOREIGN PATENT DOCUMENTS

| | | |
|---|---|---|
| JP | 2012-231037 A | 11/2012 |
| JP | 2012-248648 A | 12/2012 |

* cited by examiner

*Primary Examiner* — Kyoung Lee
*Assistant Examiner* — Joannie A Garcia
(74) *Attorney, Agent, or Firm* — Studebaker & Brackett PC

(57) ABSTRACT

A method for manufacturing an SiC semiconductor device according to the present invention includes the steps of (a) implanting an impurity into a surface layer of an SiC substrate at a concentration of $1\times10^{20}$ cm$^{-3}$ or higher, (b) forming a graphite film on a surface of the SiC substrate after the step (a), (c) activating the impurity by annealing the SiC substrate after the step (b), (d) removing the graphite film after the step (c), (e) oxidizing the surface of the SiC substrate to form an oxide film after the step (d), (f) removing the oxide film, and (g) measuring resistance of the SiC substrate by a four-point probe method after the step (f).

9 Claims, 4 Drawing Sheets

METHOD FOR MANUFACTURING SIC SEMICONDUCTOR DEVICE

BACKGROUND OF THE INVENTION

1. Field of the Invention

The present invention relates to a method for manufacturing an SiC semiconductor device, and more particularly to a method for manufacturing an SiC semiconductor device that allows the measurement of resistance by a four-point probe method.

2. Description of the Background Art

An activation annealing apparatus used in manufacturing processes of a silicon carbide (SiC) semiconductor device performs annealing at a temperature of 1600° C. or higher. In conventional silicon (Si) semiconductor devices, an annealing temperature is up to approximately 1300° C. A thermocouple (for example, JIS-standard R-type or B-type thermocouple) is inserted inside heat treatment equipment to perform temperature calibration.

When heat treatment is performed at a high temperature of 1600° C. or higher using the activation annealing apparatus, a thermocouple made of a tungsten-rhenium (W—Re) alloy can be used to perform temperature calibration, but oxidation of the thermocouple deteriorates wires of thermocouple. Therefore, since the deterioration will break the wires of thermocouple when the thermocouple is inserted twice or so in a high-temperature atmosphere, it is very difficult to steadily control the temperature calibration of the activation annealing apparatus.

Under the method using the thermocouple, a temperature distribution in a substrate surface will be measured with a substrate having the thermocouple. However, a method for welding wires of the thermocouple onto an SiC substrate also has many problems, and it is difficult to control and operate the method. Accordingly, in the current operation, a method is used to fabricate a simple patterned substrate using an SiC substrate, to calculate acceptor concentration in the substrate by measuring a C-V characteristic (capacitance-voltage characteristic) of the substrate, and to substitute for a temperature equivalent. The above-mentioned simple patterned substrate is manufactured in accordance with the following processes.

First, aluminum (Al) is implanted into the SiC substrate in order to form a p-type layer in a substrate surface layer. Next, a protective film (for example, a graphite film) is formed on the substrate surface as a pretreatment of the annealing. Then, the annealing is performed at a high temperature of 1600° C. or higher by the activation annealing apparatus in order to activate the implanted impurity. Subsequently, the protective film is removed and a cylindrical Al electrode is formed on the SiC substrate surface. Refer, for example, to Japanese Patent Application Laid-Open No. 2012-231037 and Japanese Patent Application Laid-Open No. 2012-248648 for impurity implantation into the SiC substrate, annealing, and the like.

C-V measurement is performed on the SiC substrate formed through the above processes. Al acceptor concentration in the substrate is calculated. Temperature calibration is performed by converting this Al acceptor concentration into temperature.

The above-described manufacturing processes of the simple patterned substrate applied to the method for manufacturing the conventional SiC semiconductor devices have a problem that the number of manufacturing processes increases because many other processes are also included, such as Al electrode formation and patterning.

In addition, since the measurement in the substrate surface can be performed only at a point where an electrode is formed and the measurement cannot be performed at a point without an electrode, measurement points are limited. It is not possible to perform a detailed distributive analysis of the temperature in the surface.

If measurement with a four-point probe sheet resistance measuring instrument employed in heat treatment equipment for Si devices can also be performed on the SiC substrate as a substitute for this monitoring method, it is not necessary to form an Al electrode, and it is possible to measure at any point on the substrate. However, the SiC substrate itself is too hard to make contact with a probe, so that it is impossible to perform the measurement.

SUMMARY OF THE INVENTION

An object of the present invention is to provide a method for manufacturing an SiC semiconductor device that allows the measurement of resistance by the four-point probe method.

The method for manufacturing the SiC semiconductor device according to the present invention includes the steps of: (a) implanting an impurity into a surface layer of the SiC substrate at a concentration of $1 \times 10^{20}$ cm$^{-3}$ or higher, (b) forming a graphite film on a surface of the SiC substrate after the step (a), (c) activating the impurity by annealing the SiC substrate after the step (b), (d) removing the graphite film after the step (c), (e) oxidizing the surface of the SiC substrate to form an oxide film after the step (d), (f) removing the oxide film, and (g) measuring resistance of the SiC substrate by the four-point probe method after the step (f).

The method for manufacturing the SiC semiconductor device according to the present invention makes it possible to manufacture the SiC substrate that allows measurement of the sheet resistance by the four-point probe method. This results in that it is not necessary to form an electrode on the substrate, and it is possible to fabricate the SiC substrate for temperature measurement with the minimum number of processes. In addition, it is possible to measure at any point on the fabricated SiC substrate for temperature measurement. This results in that it is possible to measure at more points in the substrate surface, and it is possible to check a temperature distribution tendency in the substrate surface.

These and other objects, features, aspects and advantages of the present invention will become more apparent from the following detailed description of the present invention when taken in conjunction with the accompanying drawings.

DESCRIPTION OF THE PREFERRED EMBODIMENT

Manufacturing processes of an SiC semiconductor device include a process of annealing an SiC substrate. The annealing is performed at a high temperature of 1600° C. or higher. It is necessary to monitor the temperature of the SiC substrate during the annealing. As described above, preferably a four-point probe method can be applied to the SiC substrate as temperature monitoring means.

The SiC substrate applied as the temperature monitoring means in the method for manufacturing the SiC semiconductor device according to the present preferred embodiment is an SiC substrate that allows the measurement of resistance using a four-point probe sheet resistance measuring instrument used in conventional Si based heat treatment equipment. The method for manufacturing the SiC semiconductor device according to the present preferred embodiment includes a temperature monitoring process. The temperature monitoring process includes a process of manufacturing the SiC substrate for the temperature monitoring as a sample substrate for performing the temperature monitoring (hereinafter described merely as an SiC substrate), and a process of measuring resistance of the manufactured SiC substrate by the four-point probe method to obtain the temperature.

Figure 1:
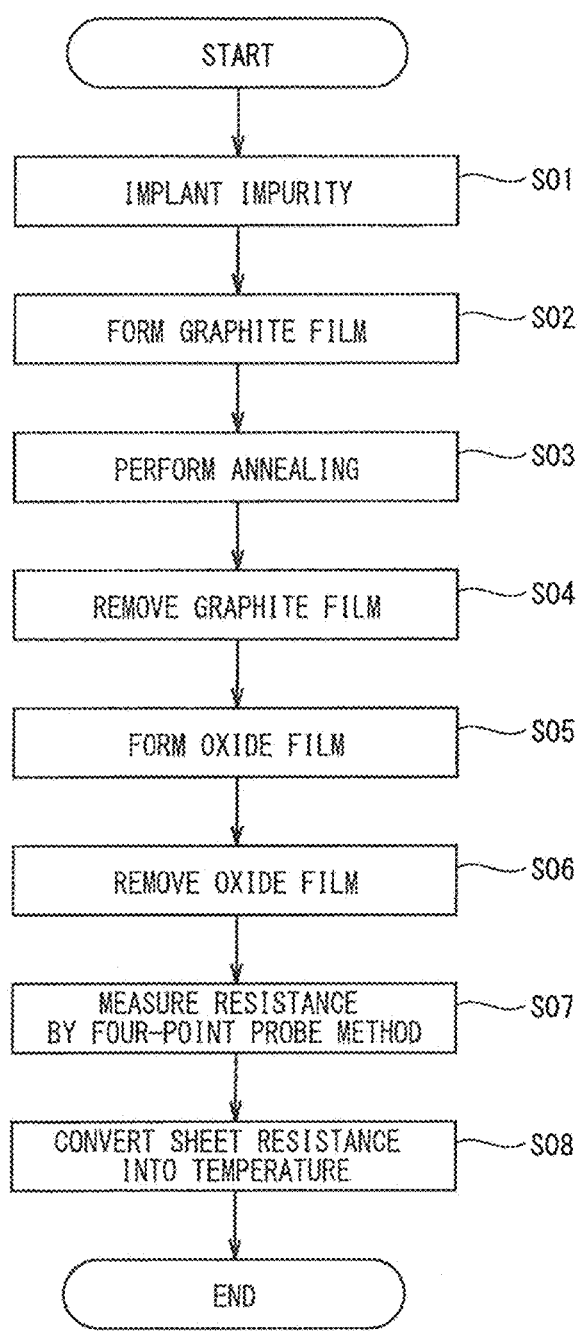
FIG. 1 is a flowchart illustrating a method for manufacturing an SiC semiconductor device according to a first preferred embodiment.

FIG. 1 is a flowchart illustrating the method for manufacturing the SiC semiconductor device, and particularly is a flowchart illustrating in detail the temperature monitoring process performed in the manufacturing method. Each step of the temperature monitoring process will be described with reference to the flowchart of the temperature monitoring process illustrated in FIG. 1. First, in step S01 of FIG. 1, an impurity (for example, Al) is implanted into an SiC substrate surface to form a p-type layer in an SiC substrate surface layer. In step S01, Al is implanted so that concentration in the substrate surface layer (substrate depth of about 50 nm) is $1 \times 10^{20}$ cm$^{-3}$ or higher. At a concentration equal to or lower than the above concentration, contact with a probe cannot be made and a measured value cannot be obtained when measured by the four-point probe method.

Figure 2:
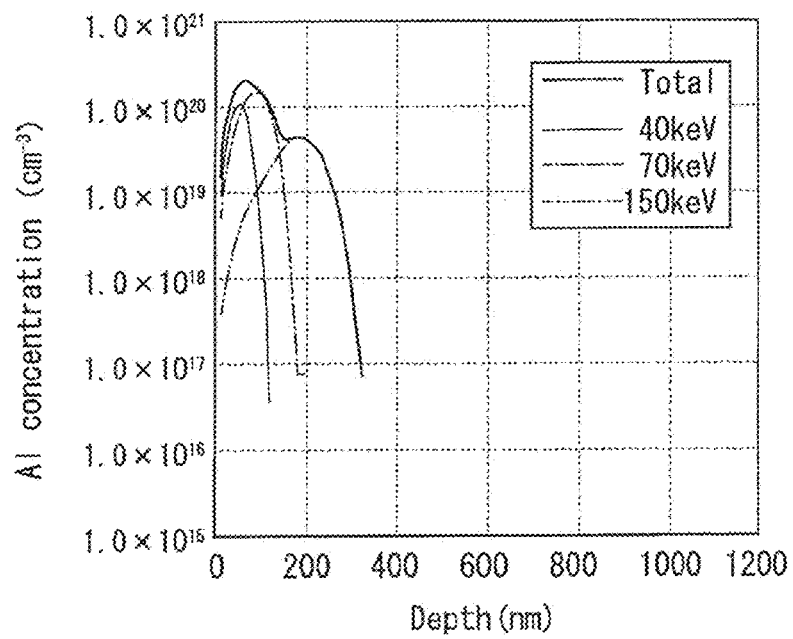
FIG. 2 is a diagram illustrating a relationship between depth from a surface of an SiC substrate and impurity concentration according to the first preferred embodiment.

FIG. 2 is a profile (relationship between the depth from the surface and the impurity concentration) of the SiC substrate. Implantation energy is changed to three levels of 40 keV, 70 keV, and 150 keV, and Al ions are implanted by an ion implantation method. As a result, as illustrated in FIG. 2, the impurity concentration is $1 \times 10^{20}$ cm$^{-3}$ or higher at a depth of approximately 50 nm from the surface.

In the present preferred embodiment, Al is implanted as the impurity. Not only Al but also other impurities are considered to provide an identical effect, but the implantation of Al has been employed as a method of forming typical p-type layer in the SiC substrate. Particularly, a p-type impurity that forms a PN junction with an n-type SiC substrate is desirable.

Next, in step S02 of FIG. 1, a protective film is formed on the SiC substrate surface. The protective film is formed in order to prevent thermal diffusion of the impurity implanted into the SiC substrate from the surface in the annealing in subsequent step S03. A graphite film is formed as the protective film so as to withstand a high temperature of 1600° C. or higher.

The graphite film can also be formed by coating on the substrate surface a resist liquid used in a photolithography process. However, for example, when the graphite film formed with the resist is annealed in a temperature range of from 1850° C. to 1900° C., local sublimation occurs due to the high temperature, and implanted Al is not protected in some portion.

Accordingly, the present preferred embodiment forms the graphite film with a gas obtained by vaporizing ethanol at a treatment temperature of 950° C. or higher by the low-pressure CVD method. Since this method allows formation of a minute film, it is possible to use the graphite film as the protective film even in a higher temperature range. The film is desirably formed with the thickness of 30 nm or more. This is because local sublimation due to the high temperature occurs and protection is not provided in some portion when the film thickness is less than 30 nm.

Subsequently, in step S03 of FIG. 1, the SiC substrate is annealed. Heat treatment at 1600° C. or higher activates the impurity (Al) implanted into the surface layer of the SiC substrate in step S01.

Next, in step S04, the graphite film formed on the SiC substrate surface is removed. The graphite film is removed by an $O_2$ plasma gas using an asher apparatus. An asher apparatus used in the manufacturing of Si substrates can be applied.

In a case of the Si substrates, it is possible to measure resistance by the four-point probe method after removal of the protective film (so-called cap film) formed before the annealing. In the SiC substrate according to the present preferred embodiment, however, even if resistance is measured by the four-point probe method after removal of the graphite film, atomic arrangement in the SiC substrate surface has deformed, so that contact with probes cannot be made. In addition, since the impurity concentration in the SiC substrate top surface is $1 \times 10^{20}$ cm$^{-3}$ or lower, as illustrated in FIG. 2, it is necessary to remove this surface layer.

From the above reasons, the surface layer of the SiC substrate is removed in steps S05 and S06 of FIG. 1. First, in step S05, heat oxidation is performed on the SiC substrate surface layer. The heat oxidation is performed in a water vapor atmosphere of 1150° C. or higher in order to accelerate the oxidation. A range of 30 nm or more and 40 nm or less in depth from the SiC substrate surface is oxidized.

Next, in step S06, an oxide film is etched. The oxide film formed in step S05 is removed by hydrogen fluoride (HF). A portion whose depth from the substrate surface is 30 to 40 nm is exposed as a top surface in steps S05 and S06. The SiC substrate for temperature measurement is completed through the above processes (steps S01 to S06).

Subsequently, in step S07, sheet resistance of the SiC substrate for temperature measurement is measured with the four-point probe sheet resistance measuring instrument. As the sheet resistance measuring instrument, it is also possible to use a measuring instrument used for Si devices. Preferably, the sheet resistance measuring instrument is configured so that a drive system for vertical movement of the probes can be controlled with constant pressure using a stepping motor or the like so as to allow control of probe pressure for the improvement in reproducibility of measured values. Since a crystal itself is hard particularly in the case of the SiC substrate, it is important to measure with constant probe pressure.

Figure 3:
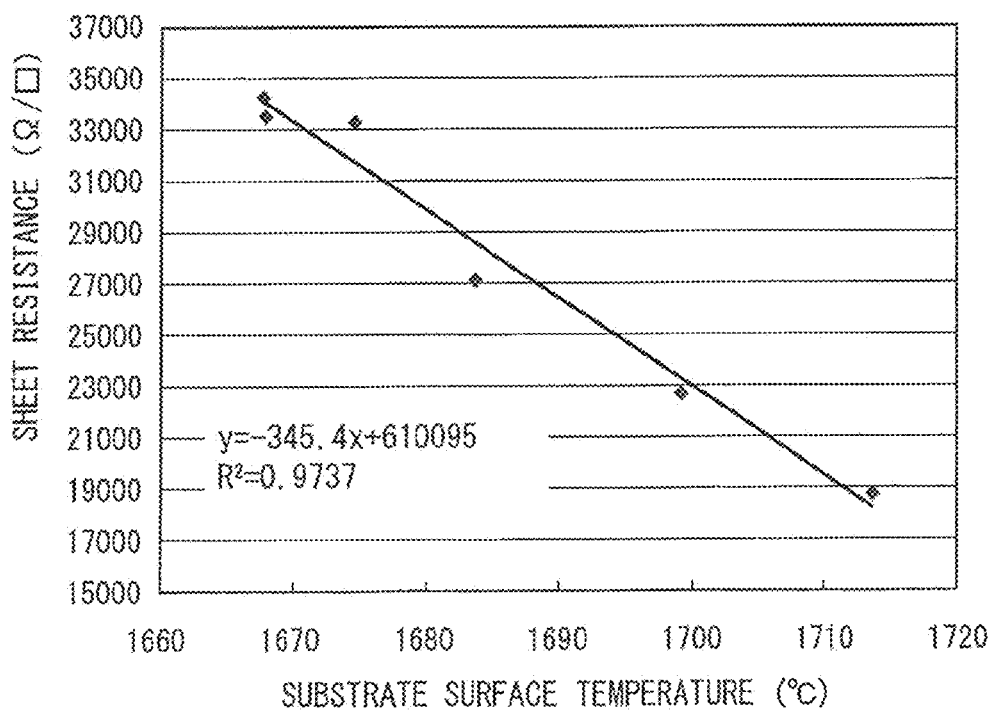
FIG. 3 is a diagram illustrating a correlation between sheet resistance and a substrate surface temperature according to the first preferred embodiment.

FIG. 3 illustrates a correlation diagram between the sheet resistance of the fabricated SiC substrate and a surface temperature of the SiC substrate. The substrate surface temperature of a horizontal axis of FIG. 3 refers to an estimate obtained by substituting the treatment temperature set in the annealing apparatus for the surface temperature of the substrate. In FIG. 3, a linear approximation is formed between the sheet resistance and the substrate surface temperature.

The four-point probe method makes it possible to measure the sheet resistance of the SiC substrate (step S07), convert the sheet resistance to the substrate surface temperature by referring to FIG. 3, and obtain the substrate surface temperature in a high temperature range of 1600° C. or higher (step S08).

Figure 4:
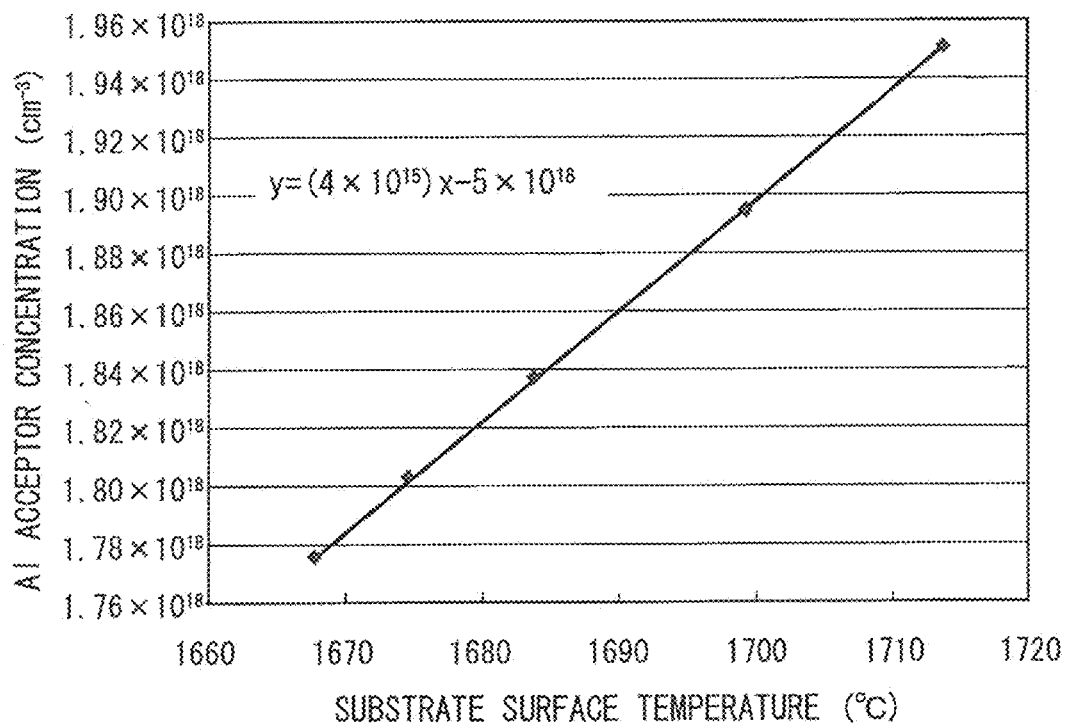
FIG. 4 is a diagram illustrating a correlation between acceptor concentration and the substrate surface temperature according to a conventional technology.

FIG. 4 illustrates a correlation diagram between Al acceptor concentration measured with a conventional patterned substrate and the substrate surface temperature. As in FIG. 3, the substrate surface temperature of a horizontal axis of FIG. 4 refers to an estimate obtained by substituting the treatment temperature set in the annealing apparatus for the surface temperature of the substrate. A vertical axis of FIG. 4 is the Al acceptor concentration. A horizontal axis is the substrate surface temperature. A linear approximation is formed between these values.

Figure 5:
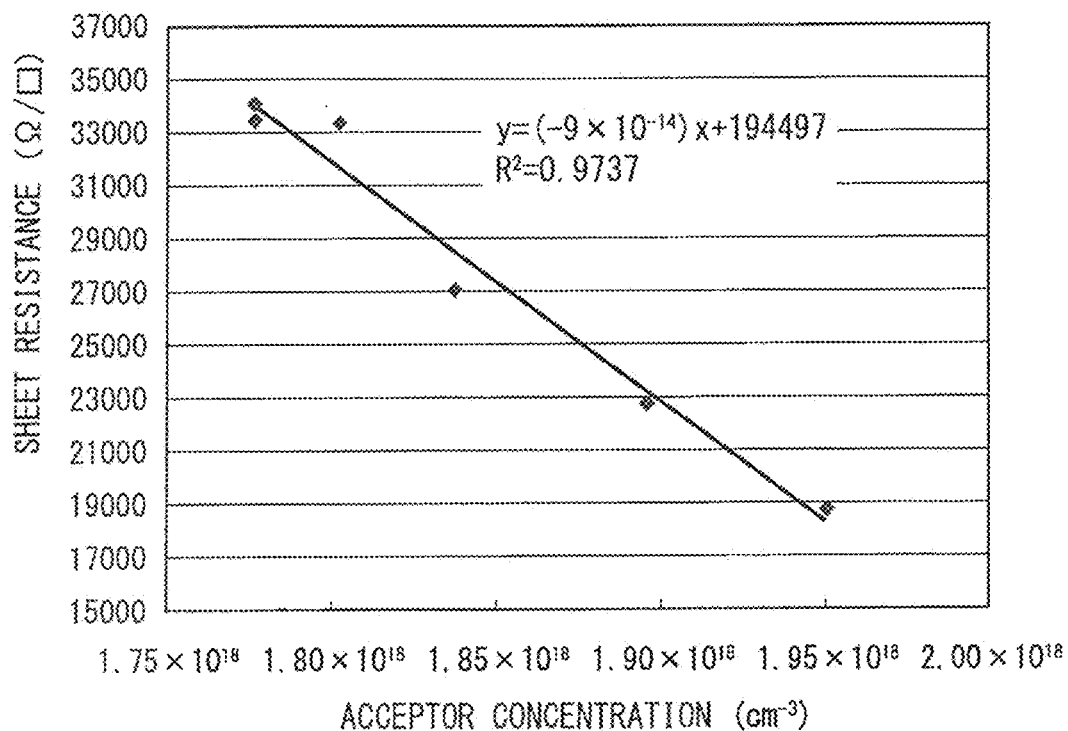
FIG. 5 is a diagram illustrating a correlation between the sheet resistance and the acceptor concentration according to the first preferred embodiment.

Therefore, it is possible to associate the sheet resistance with the Al acceptor concentration via the substrate surface temperature common in FIG. 3 and FIG. 4 (FIG. 5). As illustrated in FIG. 5, the sheet resistance and the Al acceptor concentration are linearly correlated. This means that the substrate surface temperature can be calculated from the sheet resistance by a conversion method similar to a conventional calculation of the substrate surface temperature from the Al acceptor concentration.

Figure 6:
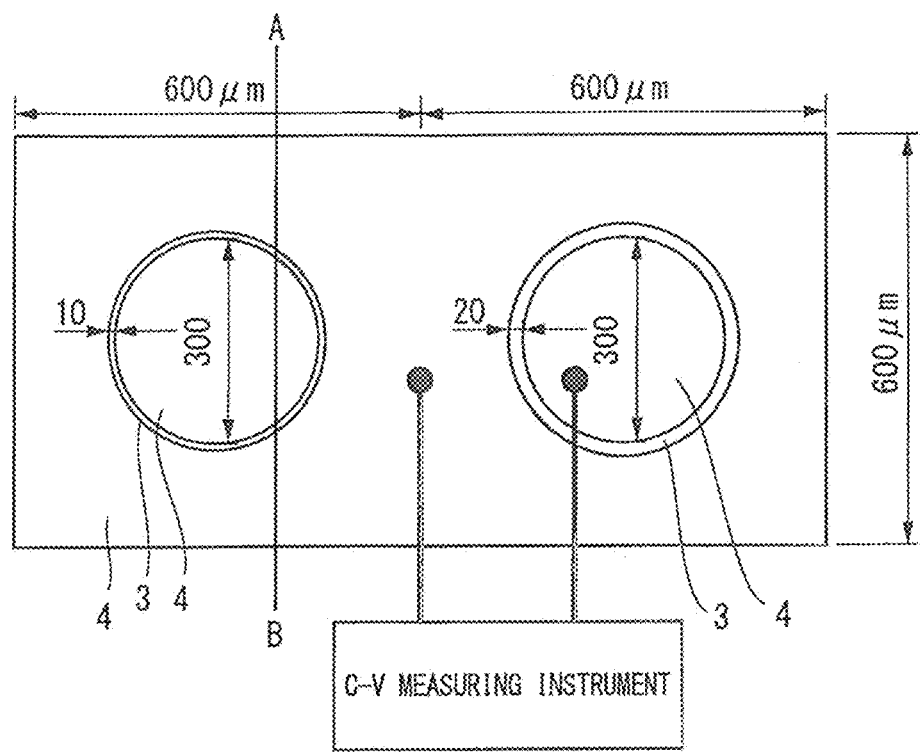
FIG. 6 is a plan view of a patterned substrate according to the conventional technology.
Figure 7:
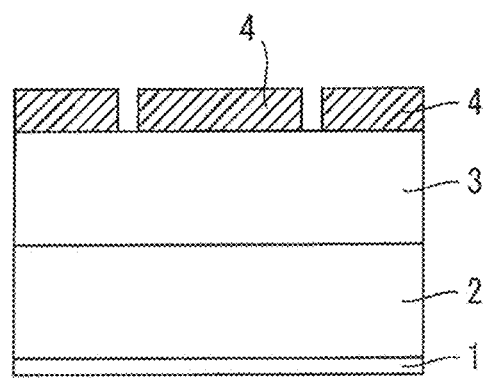
FIG. 7 is a cross-sectional view of the patterned substrate according to the conventional technology.

The correlation between the Al acceptor concentration and substrate surface temperature illustrated in FIG. 4 is obtained by performing C-V measurement of the patterned substrate in which an Al electrode is formed, as described in the background art. FIG. 6 illustrates a plan view of the patterned substrate. FIG. 7 illustrates a cross-sectional view taken along line AB in FIG. 6. As illustrated in FIG. 6, an Al electrode 4 is, for example, cylindrical. The patterned substrate includes a p-type layer 3 formed on the front surface layer of an SiC substrate 2, the Al electrode 4 cylindrically formed on the front surface of the p-type layer 3, and a back surface electrode 1 formed on the back surface of the substrate. The C-V measurement is performed by contacting probes to each of the inside and outside of the Al electrode 4.

Effects

The method for manufacturing the SiC semiconductor device according to the present preferred embodiment includes the steps of (a) implanting the impurity into the surface layer of the SiC substrate at a concentration of $1 \times 10^{20}$ cm$^{-3}$ or higher, (b) forming the graphite film on the surface of the SiC substrate after the step (a), (c) activating the impurity by annealing the SiC substrate after the step (b), (d) removing the graphite film after the step (c), (e) oxidizing the surface of the SiC substrate to form the oxide film after the step (d), (f) removing the oxide film, and (g) measuring resistance of the SiC substrate by the four-point probe method after the step (f).

Therefore, the present manufacturing processes make it possible to manufacture the SiC substrate that allows measurement of the sheet resistance by the four-point probe method. This results in that it is not necessary to form an electrode on the substrate, and it is possible to fabricate the SiC substrate for temperature measurement with the minimum number of processes. In addition, it is possible to measure at any point on the fabricated SiC substrate for temperature measurement. This results in that it is possible to measure at more points in the substrate surface, and it is possible to check a temperature distribution tendency in the substrate surface.

The method for manufacturing the SiC semiconductor device according to the present preferred embodiment includes the temperature monitoring process. The temperature monitoring process includes the above-described steps (a) to (g). The SiC substrate in the above-described steps (a) to (g) is an SiC substrate for temperature monitoring.

Therefore, it is possible to fabricate the SiC substrate for temperature measurement with the minimum number of processes in the temperature monitoring process. In addition, it is possible to measure at any point in the fabricated SiC substrate for temperature measurement. This results in that it is possible to check the temperature distribution tendency in the substrate surface.

In the method for manufacturing the SiC semiconductor device according to the present preferred embodiment, the impurity in the step (a) is aluminum. Therefore, Al is common as p-type layer implantation into the SiC substrate. Particularly a p-type impurity that forms the PN junction with the n-type SiC substrate is desirable.

In the method for manufacturing the SiC semiconductor device according to the present preferred embodiment, the thickness of the graphite film formed in the step (b) is 30 nm or more. The annealing in the step (c) is performed at 1600° C. or higher.

Therefore, covering the surface of the impurity-implanted SiC substrate with the graphite film having the thickness of 30 nm or more allows prevention of thermal diffusion of the impurity during the annealing even when the annealing is performed at a high temperature of 1600° C. or higher.

In the method for manufacturing the SiC semiconductor device according to the present preferred embodiment, the oxide film is formed in the step (e) in a water vapor atmosphere of 1150° C. or higher. The thickness of the oxide film is 30 nm or more and 40 nm or less.

Therefore, formation of the oxide film in the water vapor atmosphere of 1150° C. or higher allows further acceleration of the oxide film formation. In addition, the thickness of the oxide film in a range of 30 nm or more and 40 nm or less allows a region in which the acceptor concentration is $1 \times 10^{20}$ cm$^{-3}$ or higher to be exposed to the surface when the oxide film is removed.

Variations and omissions of the preferred embodiment of the present invention may be made within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing an SiC semiconductor device, the method comprising the steps of:
   (a) implanting an impurity into a surface layer of an SiC substrate at a concentration of $1 \times 10^{20}$ cm$^{-3}$ or higher;
   (b) forming a graphite film on a surface of said SiC substrate after said step (a);
   (c) activating said impurity by annealing said SiC substrate after said step (b);
   (d) removing said graphite film after said step (c);
   (e) oxidizing the surface of said SiC substrate to form an oxide film after said step (d);
   (f) removing said oxide film; and
   (g) measuring resistance of the SiC substrate by a four-point probe method making direct contact of a probe and said SiC substrate after said step (f).

2. A method for manufacturing an SiC semiconductor device, the method comprising a temperature monitoring process, wherein said temperature monitoring process includes the steps of:
(a) implanting an impurity into a surface layer of an SiC substrate for temperature monitoring at a concentration of $1\times10^{20}$ cm$^{-3}$ or higher;
(b) forming a graphite film on a surface of said SiC substrate after said step (a);
(c) activating said impurity by annealing said SiC substrate after said step (b);
(d) removing said graphite film after said step (c);
(e) oxidizing the surface of said SiC substrate to form an oxide film after said step (d);
(f) removing said oxide film;
(g) measuring resistance of the SiC substrate by a four-point probe method after said step (f); and
(h) determining a surface temperature of said SiC substrate based on the resistance of said SiC substrate in said step (g).

3. The method for manufacturing an SiC semiconductor device according to claim 1, wherein said impurity in said step (a) is aluminum.

4. The method for manufacturing an SiC semiconductor device according to claim 2, wherein said impurity in said step (a) is aluminum.

5. The method for manufacturing an SiC semiconductor device according to claim 1, wherein
a thickness of said graphite film formed in said step (b) is 30 nm or more, and
said annealing in said step (c) is performed at 1600° C. or higher.

6. The method for manufacturing an SiC semiconductor device according to claim 2, wherein
a thickness of said graphite film formed in said step (b) is 30 nm or more, and
said annealing in said step (c) is performed at 1600° C. or higher.

7. The method for manufacturing an SiC semiconductor device according to claim 1, wherein
said oxide film in said step (e) is formed in a water vapor atmosphere of 1150° C. or higher, and
a thickness of said oxide film is 30 nm or more and 40 nm or less.

8. The method for manufacturing an SiC semiconductor device according to claim 2, wherein
said oxide film in said step (e) is formed in a water vapor atmosphere of 1150° C. or higher, and
a thickness of said oxide film is 30 nm or more and 40 nm or less.

9. The method for manufacturing an SiC semiconductor device according to claim 5, wherein
said oxide film in said step (e) is formed in a water vapor atmosphere of 1150° C. or higher, and
a thickness of said oxide film is 30 nm or more and 40 nm or less.

* * * * *